United States Patent
Zhou

(10) Patent No.: US 11,114,551 B2
(45) Date of Patent: Sep. 7, 2021

(54) FIN FIELD-EFFECT TRANSISTOR HAVING COUNTER-DOPED REGIONS BETWEEN LIGHTLY DOPED REGIONS AND DOPED SOURCE/DRAIN REGIONS

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 32 days.

(21) Appl. No.: 16/439,339

(22) Filed: Jun. 12, 2019

(65) Prior Publication Data

US 2019/0296130 A1    Sep. 26, 2019

Related U.S. Application Data

(62) Division of application No. 15/909,285, filed on Mar. 1, 2018, now Pat. No. 10,361,288.

(30) Foreign Application Priority Data

Mar. 7, 2017  (CN) .......................... 201710130837.1

(51) Int. Cl.
*H01L 29/78* (2006.01)
*H01L 27/088* (2006.01)
(Continued)

(52) U.S. Cl.
CPC .. *H01L 29/66795* (2013.01); *H01L 21/02694* (2013.01); *H01L 21/047* (2013.01);
(Continued)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856;
(Continued)

(56) References Cited

U.S. PATENT DOCUMENTS 5,937,293 A * 8/1999 Lee .................... H01L 21/26586
                                                        438/247
6,063,673 A * 5/2000 Kao .................... H01L 29/1045
                                                        257/E21.427
(Continued)

*Primary Examiner* — Younes Boulghassoul
(74) *Attorney, Agent, or Firm* — Anova Law Group, PLLC

(57) ABSTRACT

Fin field-effect transistors are provided. A fin field-effect transistor includes a semiconductor substrate; a plurality of fins on the semiconductor substrate; a gate structure across the fins by covering portions of top and side surfaces of the fins, providing portions of the fins under the gate structure as channel regions; lightly doped regions in the fins at both sides of the gate structure; doped source/drain regions in the fins at both sides of the gate structure; and counter doped regions in fins and between the lightly doped regions and the doped source/drain regions.

8 Claims, 8 Drawing Sheets

(51) Int. Cl.

| | | |
|---|---|---|
| *H01L 29/08* | (2006.01) | |
| *H01L 29/66* | (2006.01) | |
| *H01L 21/8234* | (2006.01) | |
| *H01L 21/02* | (2006.01) | |
| *H01L 21/04* | (2006.01) | |
| *H01L 21/265* | (2006.01) | |
| *H01L 21/225* | (2006.01) | |

(52) U.S. Cl.
CPC .... *H01L 21/2251* (2013.01); *H01L 21/26586* (2013.01); *H01L 21/823418* (2013.01); *H01L 21/823431* (2013.01); *H01L 21/823468* (2013.01); *H01L 27/0886* (2013.01); *H01L 29/0847* (2013.01); *H01L 29/66492* (2013.01); *H01L 29/66636* (2013.01); *H01L 29/66803* (2013.01); *H01L 29/785* (2013.01); *H01L 29/7834* (2013.01)

(58) Field of Classification Search
CPC ... H01L 2029/7857–7858; H01L 2924/13067; H01L 29/7833–7836; H01L 29/78621; H01L 29/66636; H01L 29/66492; H01L 29/66803; H01L 29/0847; H01L 29/66537; H01L 29/6659; H01L 29/66575; H01L 21/823412; H01L 21/823418; H01L 21/047; H01L 21/2251–2253; H01L 21/26586; H01L 21/02694
See application file for complete search history.

(56) References Cited

U.S. PATENT DOCUMENTS

| | | |
|---|---|---|
| 6,144,068 A | 11/2000 | Kao et al. |
| 6,451,675 B1 | 9/2002 | Yeh et al. |
| 6,589,847 B1 | 7/2003 | Kadosh et al. |
| 6,617,219 B1 | 9/2003 | Duane et al. |
| 6,881,616 B1 | 4/2005 | Hellig et al. |
| 2007/0029577 A1 | 2/2007 | Kinoshita et al. |
| 2007/0158763 A1 | 7/2007 | Anderson et al. |
| 2007/0238273 A1 | 10/2007 | Doyle et al. |
| 2008/0179752 A1* | 7/2008 | Yamauchi ......... H01L 29/66643 257/768 |
| 2008/0203474 A1 | 8/2008 | Kang et al. |
| 2009/0004806 A1 | 1/2009 | Siprak et al. |
| 2011/0303990 A1* | 12/2011 | Dornel .............. H01L 21/26586 257/402 |
| 2013/0320434 A1 | 12/2013 | Shin et al. |
| 2015/0187915 A1 | 7/2015 | Joo et al. |
| 2015/0206874 A1* | 7/2015 | Son .................... H01L 29/7835 257/401 |
| 2017/0338341 A1 | 11/2017 | Wang et al. |
| 2018/0076281 A1 | 3/2018 | Shau et al. |
| 2018/0151706 A1 | 5/2018 | Lin et al. |

* cited by examiner

FIN FIELD-EFFECT TRANSISTOR HAVING COUNTER-DOPED REGIONS BETWEEN LIGHTLY DOPED REGIONS AND DOPED SOURCE/DRAIN REGIONS

CROSS-REFERENCES TO RELATED APPLICATIONS

This application is a divisional of U.S. patent application Ser. No. 15/909,285, filed on Mar. 1, 2018, which claims the priority of Chinese patent application No. 201710130837.1, filed on Mar. 7, 2017, the entirety of all of which is incorporated herein by reference.

FIELD OF THE DISCLOSURE

The present disclosure generally relates to the field of semiconductor manufacturing technologies and, more particularly, relates to fin field-effect transistors.

BACKGROUND

With the rapid development of semiconductor technologies, the critical dimension (CD) of semiconductor devices has been continuously reduced. Accordingly, the integration level of integrated circuits (ICs) has become higher and higher; and higher requirements for device performances have been brought out.

With the continuous reduction of the size of metal oxide semiconductor field-effect transistors (MOSFETs), the channel length of the MOSFET has to be continuously reduced to adapt to the decrease of the technology node. Consequently, shrinking the channel length is able to increase the device density of the IC chip and the switching speed of the MOSFET.

However, with the continuous reduction of the channel length, the distance between the source and the drain of the device is reduced as well. Accordingly, the control ability of the gate structure on the channel region is reduced. It is more difficult for the gate voltage to pinch off the channel. Thus, the subthreshold leakage phenomenon, i.e., short-channel effect (SCE), has become one of the critical technology issues.

To meet the requirements for the device miniaturization, semiconductor technologies have gradually transformed from planar MOSFETs to the more effective three-dimensional transistors, for example, fin field-effect transistors (FinFETs). FinFETs have sufficiently good ability to control the channels.

However, it is easy for an FinFET to have a gate-induced drain leakage (GIDL) issue when the FinFET is in operation. As a result, there is a need to solve the GIDL issues, and to improve the reliability of the fin field-effect transistors. The disclosed methods and semiconductor structures are directed to solve one or more problems set forth above and other problems in the art.

BRIEF SUMMARY OF THE DISCLOSURE

One aspect of the present disclosure includes a method for fabricating a fin field-effect transistor. The method includes providing a plurality of fins on a surface of a semiconductor substrate; forming a gate structure across the fins by covering portions of top and side surfaces of the fins, wherein portions of the fins under the gate structure are channel regions; forming lightly doped regions in the fins at both sides of the gate structure by performing a lightly doping ion implantation process; performing a counter doping ion implantation process on a portion of each lightly doped region away from the channel region to form a counter doped region in the lightly doped region; and performing a source/drain doping process on the fins at both sides of the gate structure to form doped source/drain regions.

Another aspect of the present disclosure includes a fin field-effect transistor (FinFET). The fin field-effect transistor includes a semiconductor substrate; a plurality of fins on the semiconductor substrate; a gate structure across the fins by covering portions of top and side surfaces of the fins; lightly doped regions in the fins at both sides of the gate structure; doped source/drain regions in the fins at both sides of the gate structure; and counter doped regions in fins and between the lightly doped regions and the doped source/drain regions.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-4 illustrate cross-sectional views of semiconductor structures corresponding to certain stages during a fabrication process of an FinFET.

Figure 1:
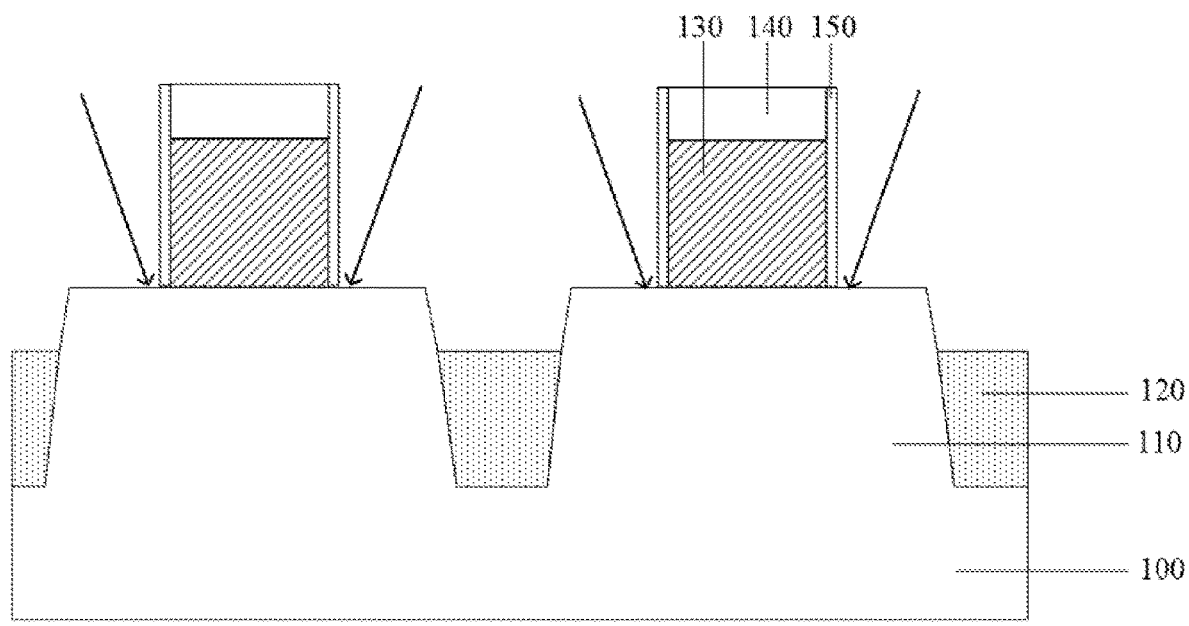
FIGS. 1-4 illustrate cross-sectional views of semiconductor structures corresponding to certain stages during a fabrication process of an FinFET.

As shown in FIG. 1, at the beginning of the fabrication process, a semiconductor substrate 100 is provided. A plurality of fins 110 are formed on the semiconductor substrate 100. Further, an isolation structure 120 is formed on the semiconductor substrate 100 exposed by the fins 110. The isolation structure 120 covers portions of the side surfaces of the fins 110. The top surface of the isolation structure 120 is below the top surfaces of fins 110. Further, a gate structure 130 across the fins 110 is formed on the semiconductor substrate 100. The gate structure 130 covers portions of top and side surfaces of the fins 110. Further, sidewall spacers 150 are formed on the side surfaces of the gate structure 130. After forming sidewall spacers 150, lightly doped regions (not shown) are formed in the semiconductor substrate 100 by an ion implantation process.

Figure 2:
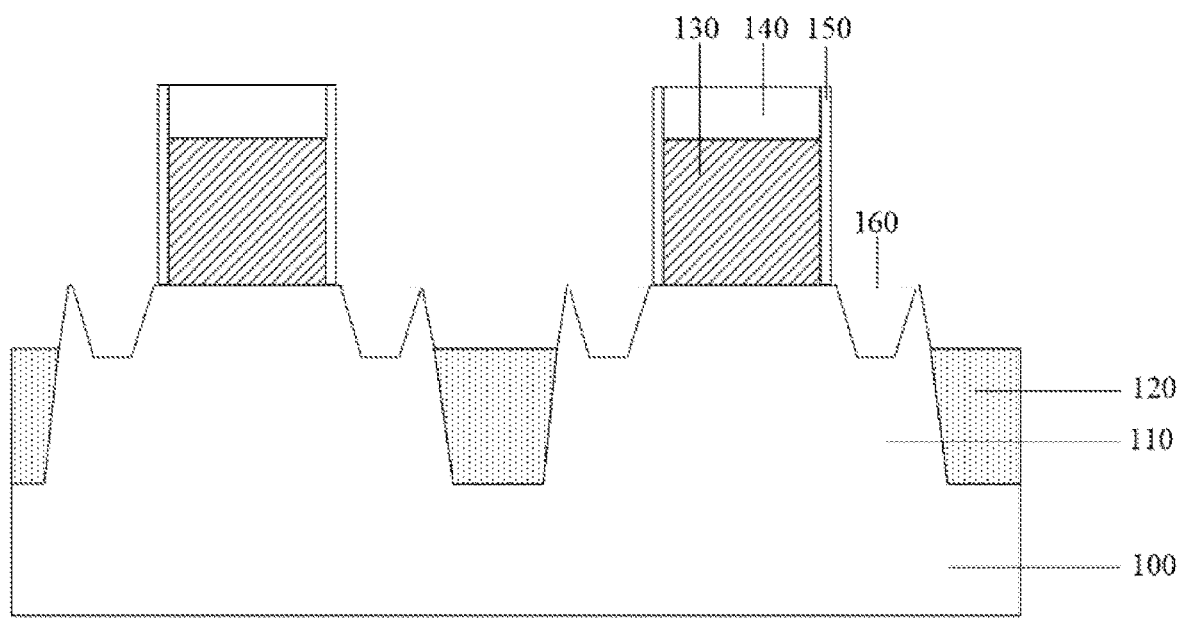

Further, as shown FIG. 2, trenches 160 are formed by etching the fins 110 at both sides of the gate structure 130.

Figure 3:
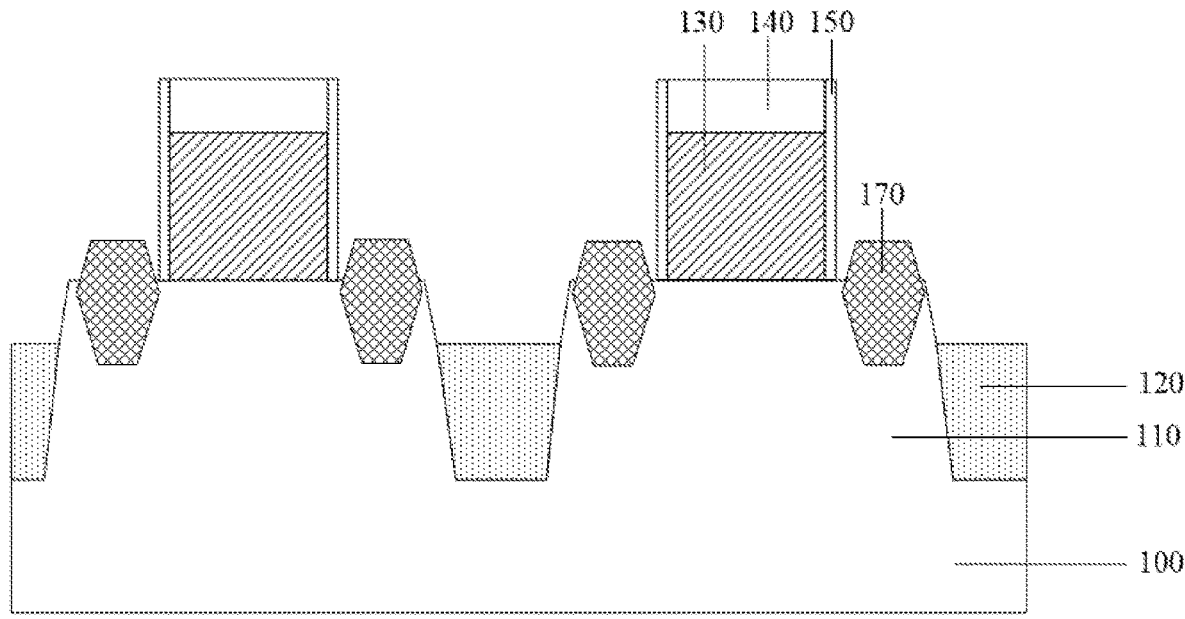

Further, as shown in FIG. 3, doped source/drain epitaxial layers are formed in the trenches 160 (as shown in FIG. 2).

Figure 4:
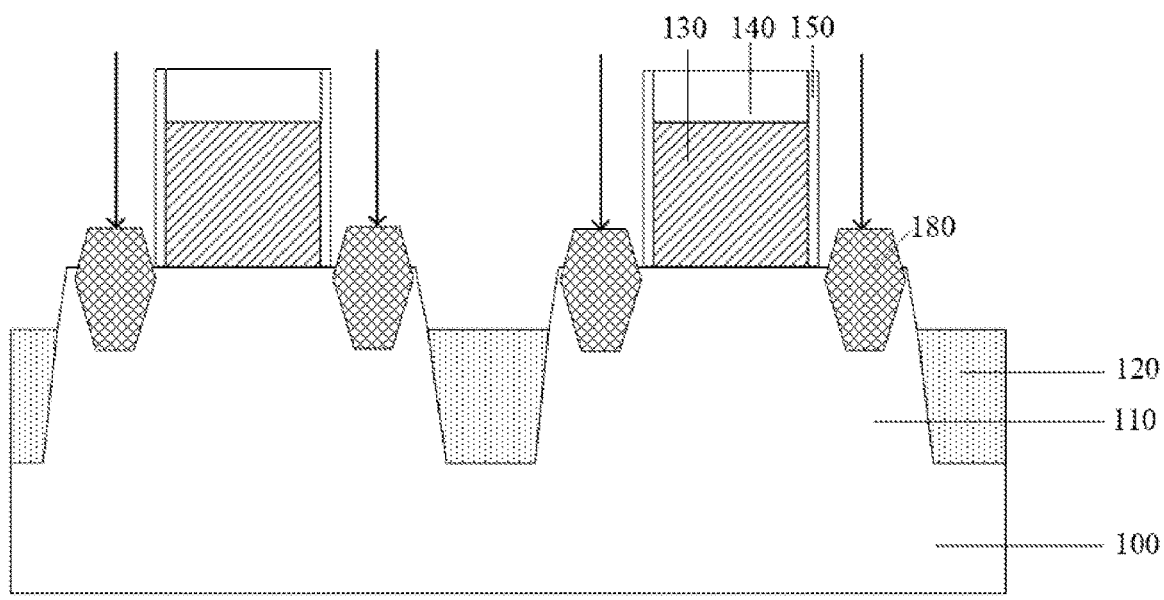

Further, as shown in FIG. 4, after forming the doped source/drain epitaxial layers 170, an ion implantation process is performed to the fins 110 at both sides of the gate structure 130 to form doped source/drain regions 180. After forming the doped source/drain regions 180, an annealing process is performed.

The reliability of the FinFET formed by such a method needs further improvement. The doping concentration is significantly high during forming the doped source/drain regions 180. The difference of the ion concentrations is significantly large between the doped source/drain regions 180 and the lightly doped regions. Thus, the ion distribution is steep between doped source/drain regions 180 and the lightly doped regions. That is, it is easy to form abrupt junctions. Thus, the gate-induced drain leakage current (GIDL) phenomenon is easy to occur in the FinFET. Accordingly, the reliability of the FinFET is reduced.

The present disclosure provides an FinFET and a fabrication method. The fabrication method may include providing a semiconductor substrate having a plurality of discrete fins; forming a gate structure across the fins and covering portions of top and side surfaces of the fins, the portions of the fins under the gate structure are the channel regions; performing a lightly doping ion implantation process on the fins at both sides of the gate structure to form lightly doped regions; performing a counter doping process to a portion of each lightly doped region away from the channel region to form a counter doped region in the lightly doped region; and forming doped source/drain regions in the fins at both sides of the gate structure by a source/drain doping process after the counter doping process.

Because of the ion diffusion between the doped source/drain regions and the counter doped regions and the ion type difference between doped ions in doped source/drain regions and the doped ions in the counter doped regions, the ion concentration in the doped source/drain regions may be reduced. Thus, the steep scale of the ion distribution between the doped source/drain regions and the lightly doped regions may be reduced. Accordingly, the gate-induced drain leakage current phenomenon of the FinFET may be reduced, and the reliability of the FinFET may be improved.

Figure 15:
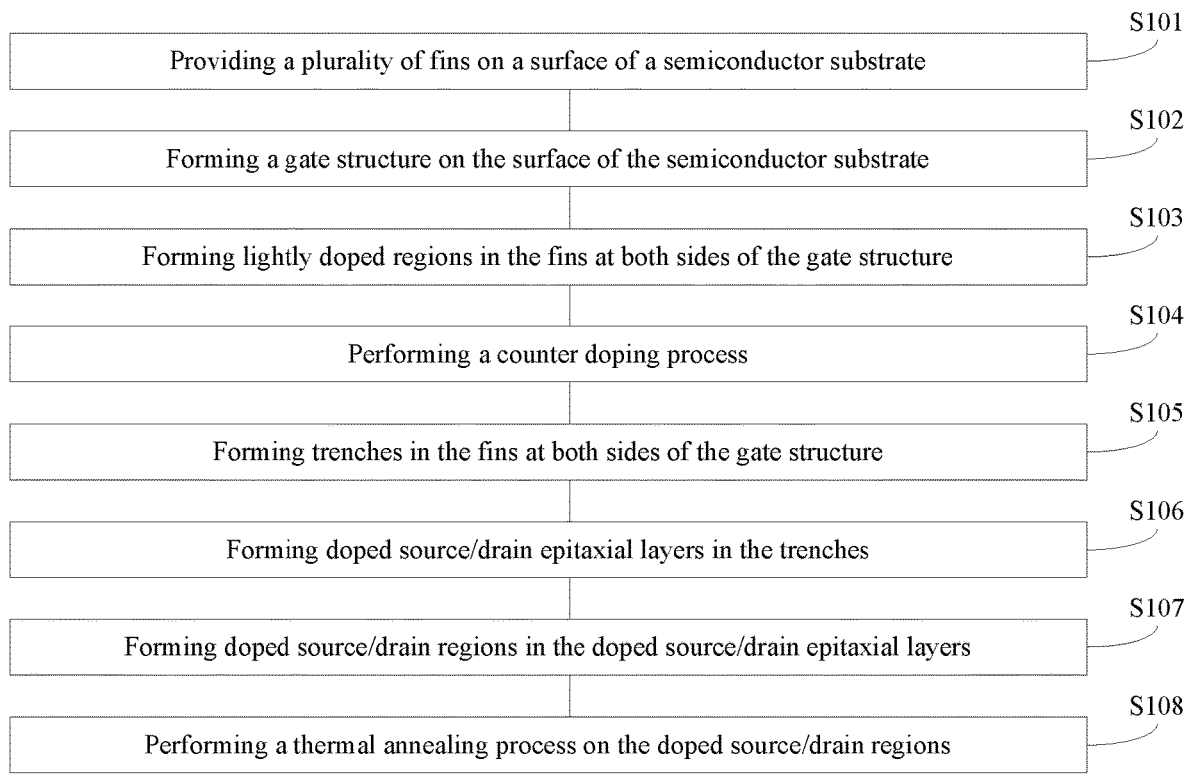
FIG. 15 illustrates an exemplary fabrication process of an FinFET consistent with various disclosed embodiments

FIG. 15 illustrates an exemplary fabrication process of an FinFET consistent with various disclosed embodiments. FIGS. 5-13 illustrate cross-sectional views of the semiconductor structure corresponding to certain stages during the exemplary fabrication process.

Figure 5:
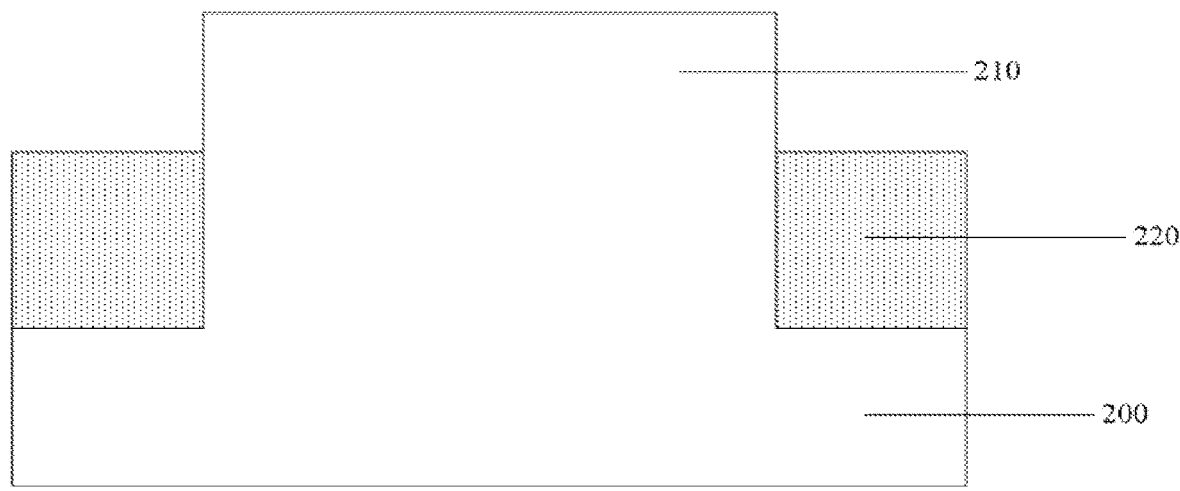
FIGS. 5-13 illustrate cross-sectional views of semiconductor structures corresponding to certain stages during an exemplary fabrication process of an FinFET consistent with various disclosed embodiments.

As shown in FIG. 15, at the beginning of the fabrication process, a semiconductor substrate with certain structures is provided (S101). FIG. 5 illustrates a corresponding semiconductor structure.

As shown in FIG. 5, a semiconductor substrate 200 is provided. A plurality of discrete fins 210 may be formed on the semiconductor substrate 200. For illustrative purposes, only one fin 210 is shown in FIG. 5, although any appropriate number of fins may be included in the present disclosure.

In one embodiment, the semiconductor substrate 200 is made of silicon. In some embodiments, the semiconductor substrate may be made of germanium, silicon germanium, silicon carbide, gallium arsenide, or indium gallium, etc. In some other embodiments, the semiconductor substrate may also be a silicon on insulator (SOI) substrate, or a germanium on insulator (GOI) substrate, etc.

In one embodiment, the fin 210 is made of silicon. In some embodiments, the fin may also be made of germanium, silicon germanium, silicon carbide, gallium arsenide, or gallium indium, etc.

In one embodiment, an isolation structure 220 may be formed on the semiconductor substrate 200 exposed by the fins 210. The isolation structure 220 may cover portions of the side surfaces of the fin 210. The top surface of the isolation structure 220 is below the top surface of the fin 210.

The isolation structure 220 may be used to electrically isolate adjacent fins 210.

In one embodiment, the isolation structure 220 is made of silicon oxide. In some embodiments, the isolation structure may also be made of silicon nitride, or silicon oxynitride, etc.

In one embodiment, a process for forming the semiconductor substrate 200 and the fin 210 may include providing an initial substrate; forming a patterned hard mask layer on the initial substrate; and etching the initial substrate using the patterned hard mask layer as an etching mask layer. The etched initial substrate may be configured as the semiconductor substrate 200; and the portion protruding from the semiconductor substrate 200 may be configured as the fin 210.

The hard mask layer may be retained on the fin 210. The hard mask layer on the top surface of the fin 210 may protect the fin 210 during the subsequent process for forming the isolation structure 220.

A method for forming the isolation structure 220 may include forming an isolation film on the semiconductor substrate 200. The isolation film may cover the fin 210; and the top surface of the isolation film may be above the top surface of the fin 210. Further, the method may include performing a planarization process on the isolation film; and etching back the planarized isolation film to remove a partial thickness of the isolation film. Thus, the isolation structure 200 may be formed on the base substrate 200. During the etch-back process, the hard mask layer may be removed.

In one embodiment, after forming the isolation structure 220, an oxide layer (not shown) may be formed on portions of the surfaces of the fin 210 exposed by the isolation structure 220. The oxide layer is may be made of silicon oxide, etc.

Figure 6:
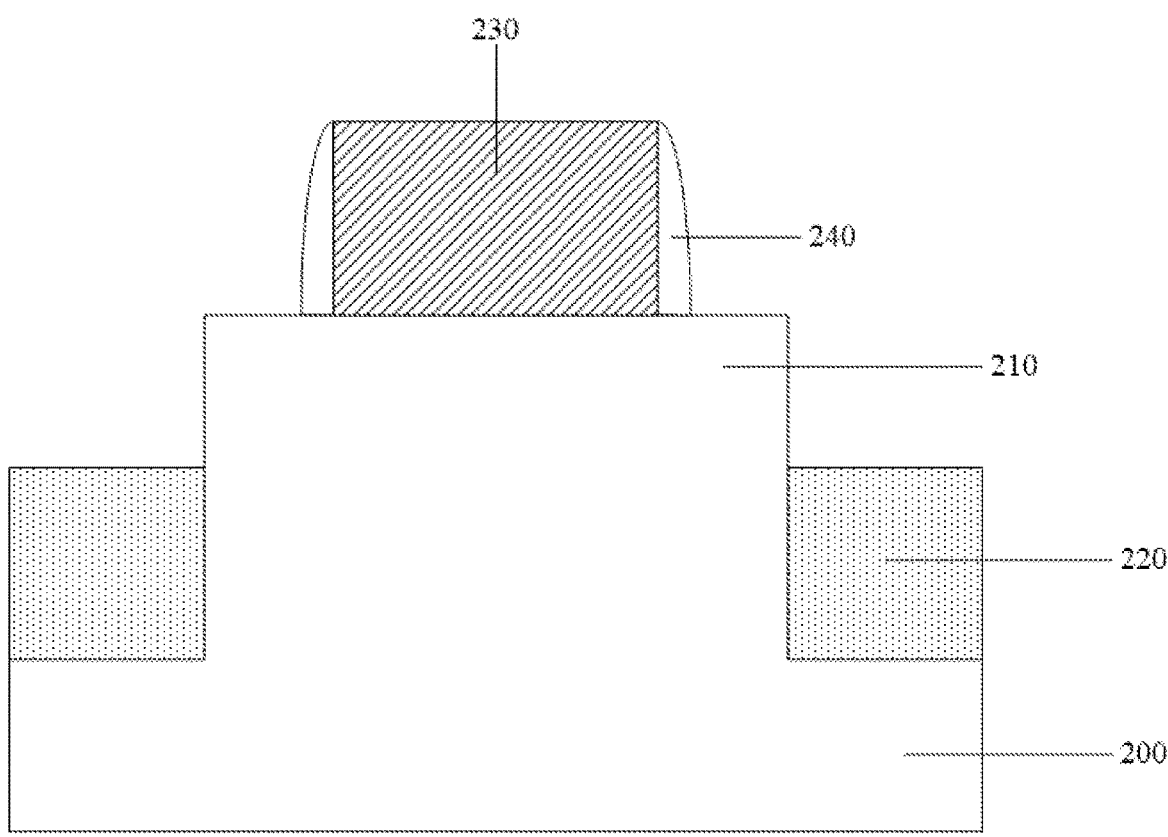

Returning to FIG. 15, after forming the isolation structure, a gate structure may be formed (S102). FIG. 6 illustrates a corresponding semiconductor structure.

A shown in FIG. 6, a gate structure 230 is formed over the semiconductor substrate 200. The gate structure 230 may be across the fin 210 by covering the top and the side surfaces of the fin 210. The region of the fin 210 under the gate structure 230 may be used as the channel region of the FinFET.

A method for forming the gate structure 230 may include forming a gate electrode layer to cover the semiconductor substrate 200 and the fin 210; forming a hard mask layer defining the pattern of the gate structure 230 on the gate electrode layer; and etching the gate electrode layer using the hard mask layer as an etching mask to form the gate structure 230 across the fin 210. After forming the gate structure 230, the hard mask layer on the top surface of the fin 210 may be removed.

The gate structure 230 may be a polysilicon gate structure, or a metal gate structure, etc.

In one embodiment, after forming the gate structure 230, sidewall spacers 240 may be formed on the side surfaces of the gate structure 230. The sidewall spacers 240 may be used to define the locations of the subsequently formed lightly doped regions. The sidewall spacers 240 may be made of silicon nitride, etc.

Figure 7:
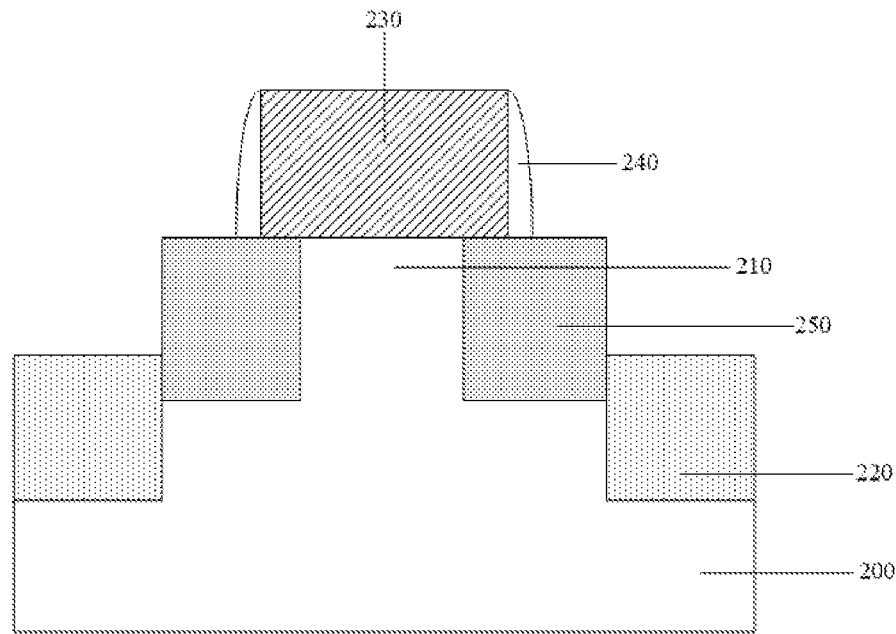

Returning to FIG. 15, after forming the gate structure, lightly doped regions may be formed (S103). FIG. 7 illustrates a corresponding semiconductor structure.

As shown in FIG. 7, the lightly doped regions 250 are formed in the fin 210 at both sides of the gate structure 230.

The lightly doped regions 250 may be formed by performing a lightly doping ion implantation process in the fin 210 at both sides of the gate structure 230. The lightly doped regions 250 may be able to prevent the ion diffusion during the subsequent process for forming doped source/drain regions; and the junction leakage current may be reduced.

When the formed fin effect-field transistor is an NMOS transistor, the ions of the lightly doping ion implantation process may be N-type ions, such as phosphor ions, arsenic ions, antimony ions, etc. When the formed fin effect-field transistor is a PMOS transistor, the ions of the lightly doping ion implantation process may be P-type ions, such as boron ions, gallium ions, or indium ions, etc.

In one embodiment, during the lightly doping ion implantation process for forming the lightly doped regions, the direction of the ion beam and the normal of the top surface of the fin 210 may have an appropriate angle. Controlling such an angle may be able to cause the lightly doped regions 250 to be close to the channel region. If the angle is too big, it may cause a severe shadowing-effect to the FinFET. If the angle is too small, the depth of the ion implanting effect may be insufficient.

In one embodiment, during the lightly doping ion implantation process, the angle between the normal of the top surface of the fin and the direction of the ion beam may be in a range of approximately is 7°-30°. The angle between the direction of the ion beam and the length direction of the gate structure 230 may be in a range of approximately 40°-50°.

In one embodiment, when the implanting ions are phosphorous ions, the implanting energy may be in a range of approximately 8 keV to 20 keV; and the implanting dose may be in a range of approximately $1.0E14$ atom/cm$^2$-$1.0E16$ atom/cm$^2$. When boron ions are implanted, the implanting energy may be in a range of approximately 15 keV to 30 keV; and the dose may be in a range of approximately $1.0E14$ atom/cm$^2$-$1.0E16$ atom/cm$^2$.

Figure 8:
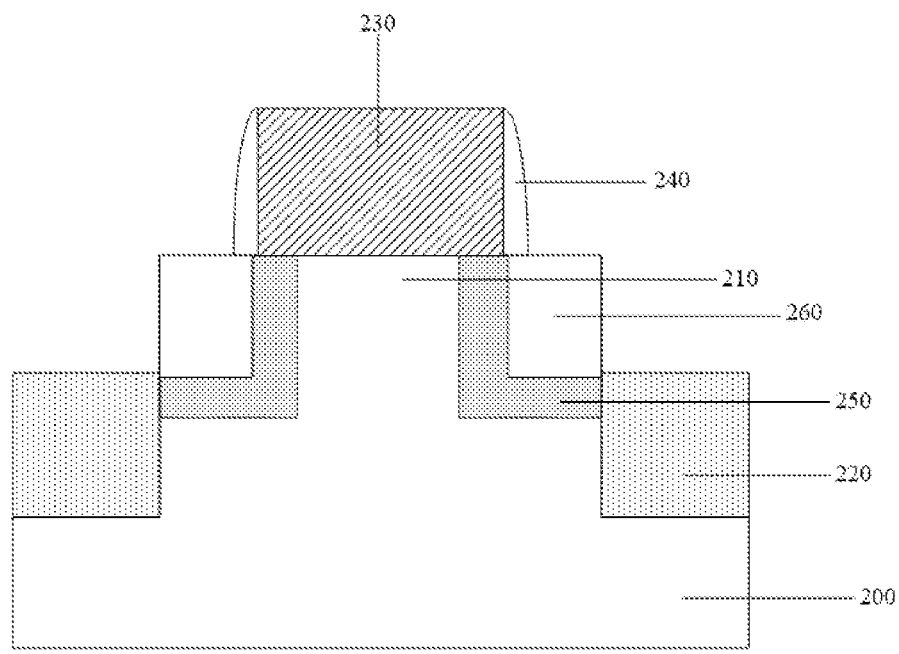

Returning to FIG. 15, after forming the lightly doped regions, a counter doping process may performed (S104). FIG. 8 illustrates a corresponding semiconductor structure.

An shown in FIG. 8, a counter doping process is performed on portions of lightly doped regions 250 away from the channel region; and counter doped regions 260 may be formed.

The counter doped regions 260 may be used to reduce the ion concentration in the doped source/drains during subsequent processes. Specifically, after the subsequent process for forming the doped source/drain regions, an annealing process may be performed. The annealing process may cause the high concentration ions in the doped source/drain regions and the ions in the counter doped regions 260 to have an inter-diffusion. Thus, the concentration of the ions in the doped source/drain regions may be reduced. Accordingly, the degree of the transition steep of the ion distribution between doped source/drain regions and lightly doped regions 250 may be reduced. Thus, the gate-induced drain leakage current phenomenon of the FinFET may be reduced.

If the difference of the ion concentration between doped source/drain regions and the lightly doped regions 250 is too large, the transition of the ion distribution in the doped source/drain regions and the lightly doped regions 250 may be substantially steep, and abrupt junctions may be easily formed. Accordingly, the gate-induced drain leakage current phenomenon of the FinFET may be more severe.

The type of the ions in the counter doped regions 260 may be different from the type of the ions in the lightly doped region 250. Specifically, when the FinFET is an NMOS transistor, the implanting ions of the lightly doping ion implantation process are N-type ions; and the implanting ions in the counter doped regions 260 are P-type ions. When the FinFET is a PMOS transistor, the implanting ions of the lightly doping ion implantation process are P-type ions; and the implanting ions in the counter doped regions 260 are N-type ions.

In one embodiment, during the counter doping process for forming the counter doped regions 260, the angle of the normal of the top surface of the fin 210 and the direction of the ion beam of the counter doping process may be an appropriate value. Control the angle of the normal of the top surface of the fin 210 and the direction of the ion beam of the counter doping process may cause the counter doped regions 260 to be in the lightly doped regions 250 away from the channel region. If the angle is too large, the shadow effect of the FinFET may be too severe. If the angle is too small, the depth of the counter doping process may be not enough.

In one embodiment, during the counter doping process for forming the counter doped regions 260, the angle of the normal of the top surface of the fin 210 and the direction of the ion beam of the counter doping process may be in a range of approximately 7°-30°.

The concentration of the ions in the counter doped regions 260 may be any appropriate value. If the concentration of the ions in the counter doped regions 260 is too large. the concentration of the ions in the subsequently formed doped source/drains may be too small. Accordingly, the ion concentration gradient between doped source/drain regions and the lightly doped region 250 may be relatively large.

In one embodiment, the concentration of the ions in the counter doped regions 260 may be in a range of approximately $1.0E18$ atom/cm$^3$-$1.0E20$ atom/cm$^3$.

The counter doping process performed on the portions of the lightly doped regions 250 away from the channel to form the counter doped regions 260 may use any appropriate parameters. When phosphor ions are implanted into the lightly doped regions 250, the implanting energy may be in a range of approximately 2 keV to 10 keV; and the implanting dose may be in a range of approximately $1.0E14$ atom/cm$^2$-$1.0E15$ atom/cm$^2$. When boron ions are implanted into the lightly doped regions 250, the implanting energy may be in a range of approximately 5 keV-15 keV; and the implanting dose may be in a range of approximately $1.0E14$ atom/cm$^2$-$1.0E15$ atom/cm$^2$.

In one embodiment, after the counter doping process, a first annealing process may be performed. The first annealing process may be any appropriate thermal annealing process. In one embodiment, the first annealing process is a spike thermal annealing process. The temperature of the first annealing process may be in a range of approximately 950° C.-1050° C. The first annealing process may be used to repair and activate the ions in the lightly doped regions 250 and the counter doped regions 260 so as to reduce the lattice defects generated during forming the lightly doped regions 250 and the counter doped regions 260. Accordingly, the quality of subsequently formed doped source/drain regions may be improved.

Figure 9:
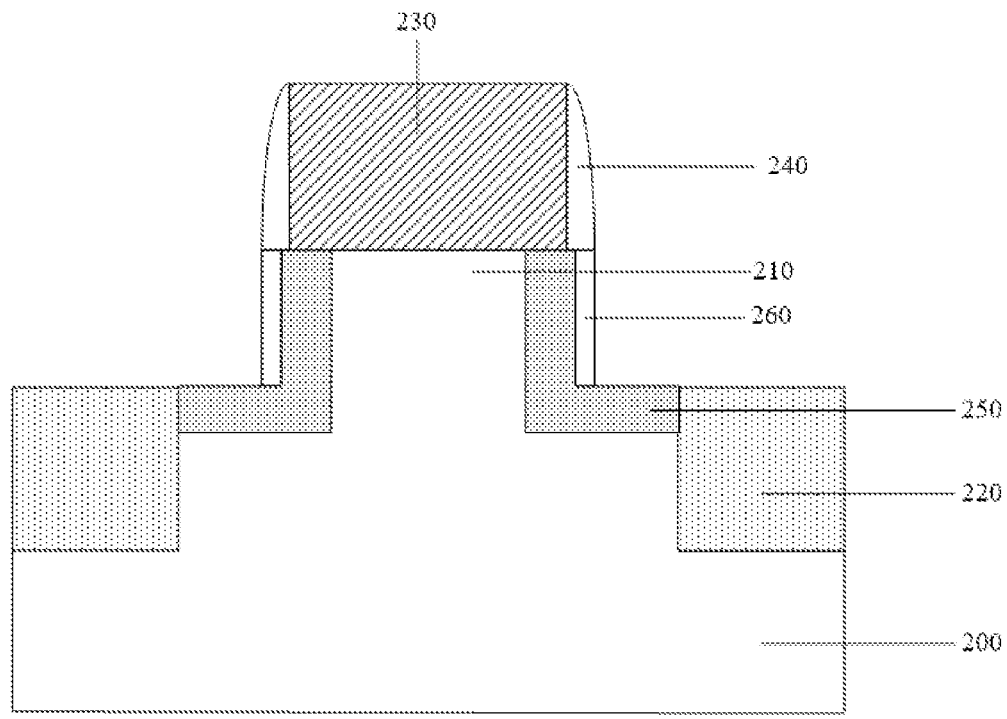

Returning to FIG. 15, after performing the counter doping process, trenches may be formed (S105). FIG. 9 illustrates a corresponding semiconductor structure.

As shown in FIG. 9, portions of the fin 210 in the counter doped regions 260 at both sides of the gate structure 230 may be etched; and trenches (not shown) may be formed.

The trenches may provide spaces for subsequently forming doped source/drain regions.

A process for forming trenches may include etching portions of the fin 210 at the counter doped regions 260 at two sides of the gate structure 230; and portions of the counter doped regions 260 on side surfaces of the trenches may be retained so as to allow the counter doped regions 260 to be between trenches and the lightly doped regions 250.

In one embodiment, the counter doped regions 260 may be between the trenches (not shown) and the lightly doped regions 250. Such a configuration may allow the high concentration ions in subsequently doped source/drain regions to diffuse into the counter doped regions 260. By controlling the etching size of the portions of the fin 210 in the counter doped regions 260 at two sides of the gate structure 230, the diffusion degree of the high concentration ions in the subsequently formed doped source/drain regions can be controlled. The larger the etched size is, the smaller the amount of the ions in the counter doped regions 260 is; and the smaller the diffusion degree is. The smaller the etched size is, the larger the amount of the ions in the counter doped regions 260 is; and the larger the diffusion degree is.

In one embodiment, a process for etching the portions of the fin 210 in the counter doped regions 260 at two sides of the gate structure 230 to form the trenches may include etching the portions of the fin 210 in the counter doped regions 260 at two sides of the gate structure 230. Along the length direction of the fin 210, the remaining counter doped regions 260 may be between the trenches and the lightly doped regions 250.

The etching process may be any appropriate etching process. In one embodiment, a dry etching process is used to etch the portions of the fin 210. The etching gas of the dry etching process may be a mixture of $CF_4$, $CH_3F$, and $O_2$, etc. The flow rate of $CF_4$ may be in a range of approximately 5 sccm-100 sccm. The flow rate of $CH_3F$ may be in a range of approximately 8 sccm-50 sccm. The flow rate of 02 may be in a range of approximately 10 sccm-100 sccm. The pressure of the dry etching process may be in a range of approximately 0-2000 mTorr. The etching time may be in range of approximately 4 s-50 s. The RF power of the dry etching process may be in a range of approximately 50 W-300 W. The voltage of the dry etching process may be in a range of approximately 30 V-100 V.

Figure 10:
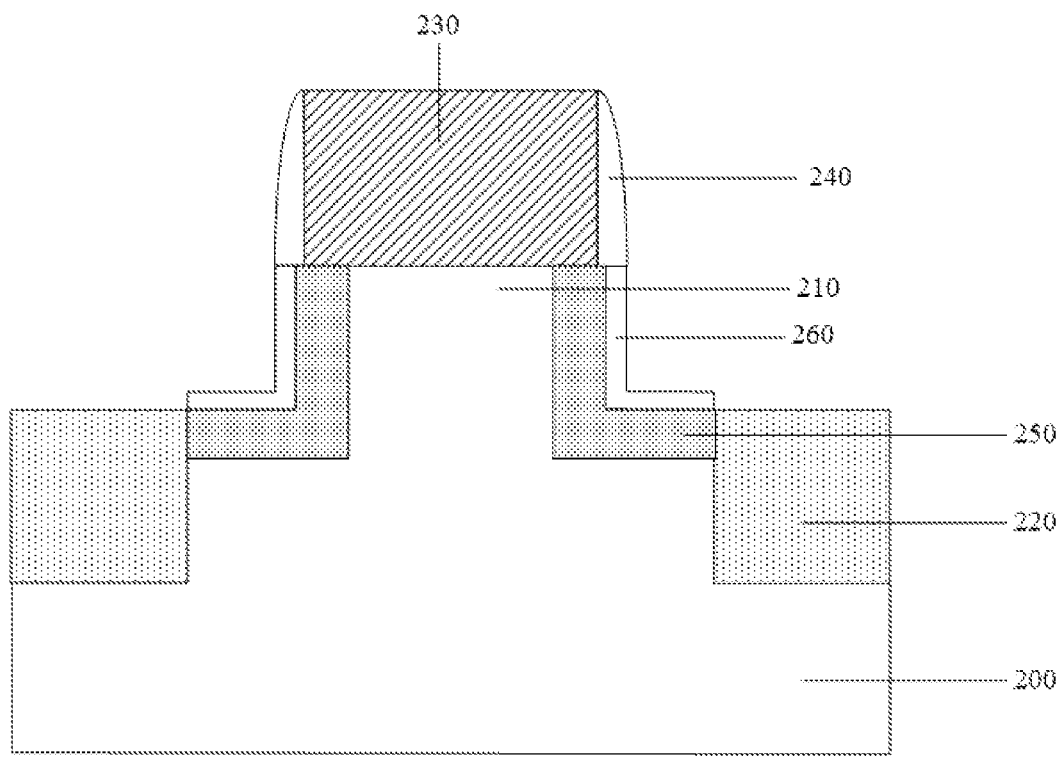

In some embodiments, as shown in FIG. 10, the process for etching the portions of the fin 210 in the counter doped regions 260 at two sides of the gate structure 230 to form the trenches may include etching portions of the fin 210 in the counter doped regions 260 exposed by the sidewall spacers 240 at the two sides of gate structure 230. Along the length direction fin 210 and the direction perpendicular to the semiconductor substrate 200, the remaining counter doped regions 260 may be between the trenches and the lightly doped regions 250.

The etching process may be any appropriate etching process. In one embodiment, a dry etching process is used to etch the portions of the fin 210. The etching gas of the dry etching process may be a mixture of He, $CH_3F$, and $O_2$, etc. The flow rate of He may be in a range of approximately 50 sccm-200 sccm. The flow rate of $CH_3F$ may be in a range of approximately 100 sccm-500 sccm. The flow rate of 02 may be in a range of approximately 5 sccm-315 sccm. The etching time may be in range of approximately 5 s-100 s. The temperature of the dry etching process may be in a range of approximately 20° C.-55° C.

Figure 11:
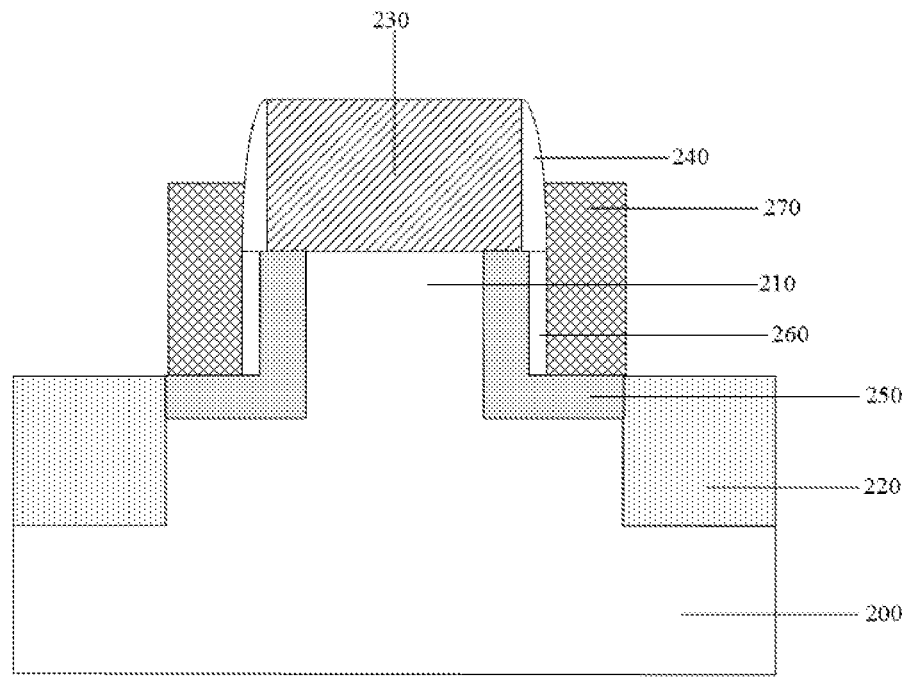

Returning to FIG. 15, after forming the trenches, doped source/drain epitaxial layers may be formed (S106). FIG. 11 illustrates a corresponding semiconductor structure.

As shown in FIG. 11, doped source/drain epitaxial layers 270 are formed. One doped source/drain epitaxial layer 270 is formed in each of the trenches. In one embodiment, the doped source/drain epitaxial layers 270 may be formed by filling the trenches by an epitaxial growth process. During the epitaxial growth process, an in situ doping process may be performed to form the doped source/drain epitaxial layers 270.

When the doped source/drain epitaxial layers 270 are made of N-type doped SiP, the temperature of the epitaxial growth process may be in a range of approximately 650° C.-850° C. The pressure of the epitaxial growth process may be in a range of approximately 10 Torr to 600 Torr. The precursor of the epitaxial growth process may be a mixture of $H_2$, HCl, $SiH_2Cl_2$, and $PH_3$. etc. The flow rate of $H_2$ may be in a range of approximately 2000 sccm to 20000 sccm. The flow rate of HCl may be in a range of approximately 30 sccm-150 sccm. The flow rate of $SiH_2Cl_2$ may be in a range of approximately 50 sccm to 1000 sccm. The flow rate of $PH_3$ may be in a range of approximately 10 sccm to 2000 sccm.

When the doped source/drain epitaxial layers 270 are made of P-type doped SiGe, the temperature of the epitaxial growth process is in a range of approximately 600° C.-850° C. The pressure of the epitaxial growth process may be in a range of approximately 8 Torr to 300 Torr. The precursor of the epitaxial growth process may be a mixture of $H_2$, HCl, $SiH_2Cl_2$, $GeH_4$, and $B_2H_6$, etc. The flow rate of $H_2$ may be in a range of approximately 1000 sccm to 30000 sccm. The flow rate of HCl may be in a range of approximately 10 sccm-200 sccm. The flow rate of $SiH_2Cl_2$ may be in a range of approximately 20 sccm to 2000 sccm. The flow rate of $GeH_4$ may be in a range of approximately 10 sccm to 500 sccm. The flow rate of $B_2H_6$ may be in a range of approximately 5 sccm to 100 sccm.

Figure 12:
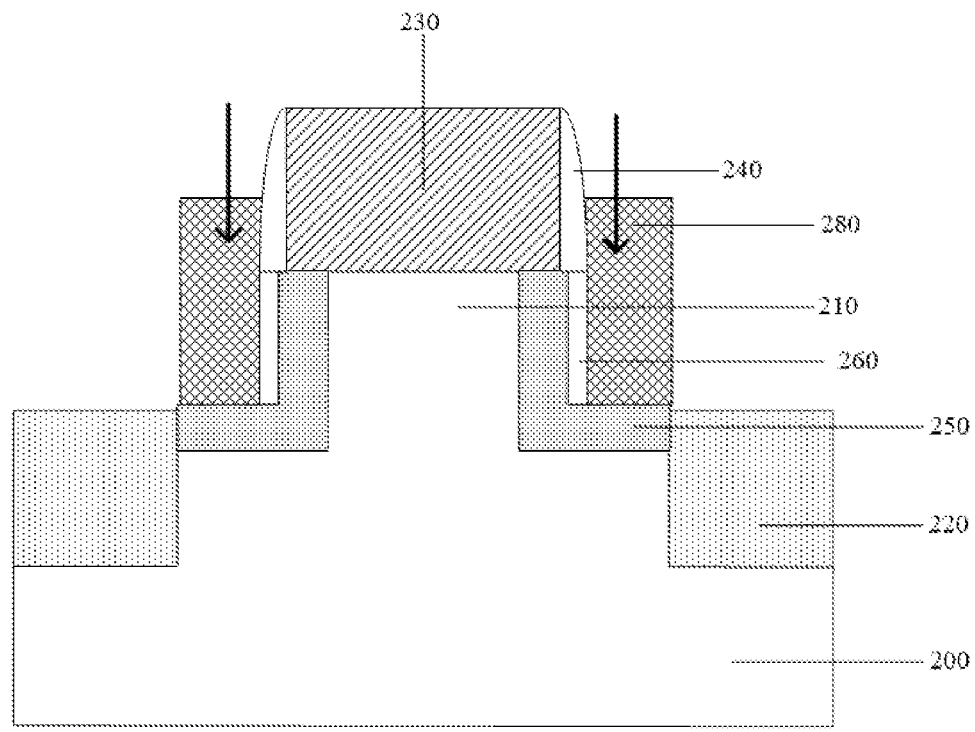

Returning to FIG. 15, after forming the doped source/drain epitaxial layers, doped source/drain regions may be formed (S107). FIG. 12 illustrates a corresponding semiconductor structure.

As shown in FIG. 12, doped source/drain regions 280 are formed. The doped source/drain regions 280 may be formed by performing an ion implantation process on the doped source/drain epitaxial layers 270.

The ion implantation process may be used to change the serial resistances and contact resistances of the fin field-effect transistor.

The type of the doping ions in doped source/drain regions 280 may be different from the type of the doping ions in the counter doped regions 260. Specifically, when the fin field-effect transistor is an NMOS transistor, the doping ions in doped source/drain regions 280 may be N-type. When the fin field-effect transistor is a PMOS transistor, the doping ions in doped source/drain regions 280 may be P-type.

In one embodiment, when the doping ions are arsenic ions, the energy of the ion implantation process may be in a range of approximately 2 keV-10 keV. The implanting dose may be in a range of approximately from 2.0E15 atom/$cm^2$-5.0E15 atom/$cm^2$. When the doping ions are boron ions, the energy of the ion implantation process may be in a range of approximately 2 keV-5 keV. The implanting dose may be in a range of approximately from 2.0E15 atom/$cm^2$-5.0E15 atom/$cm^2$.

The ions in the doped source/drain regions 280 and the ions in the counter doped regions 260 may inter-diffuse, and the ions in the doped source/drain regions 280 and the ions in the counter doped regions 260s may have different types. Thus, the concentration of the ions in the doped source/drain regions 280 may be reduced. Because the concentration of the ions in the doped source/drain regions 280 may be reduced, the concentration difference between the ions in the doped source/drain regions 280 and the ions in the counter doped regions 260 may be reduced. Accordingly, the transition steep degree of the ion distribution in the FinFET between the doped source/drain regions 280 and the lightly doped regions 250 may be reduced. Thus, the gate-induced drain leakage current of the FinFET may be reduced; and the reliability of the FinFET may be improved.

Figure 13:
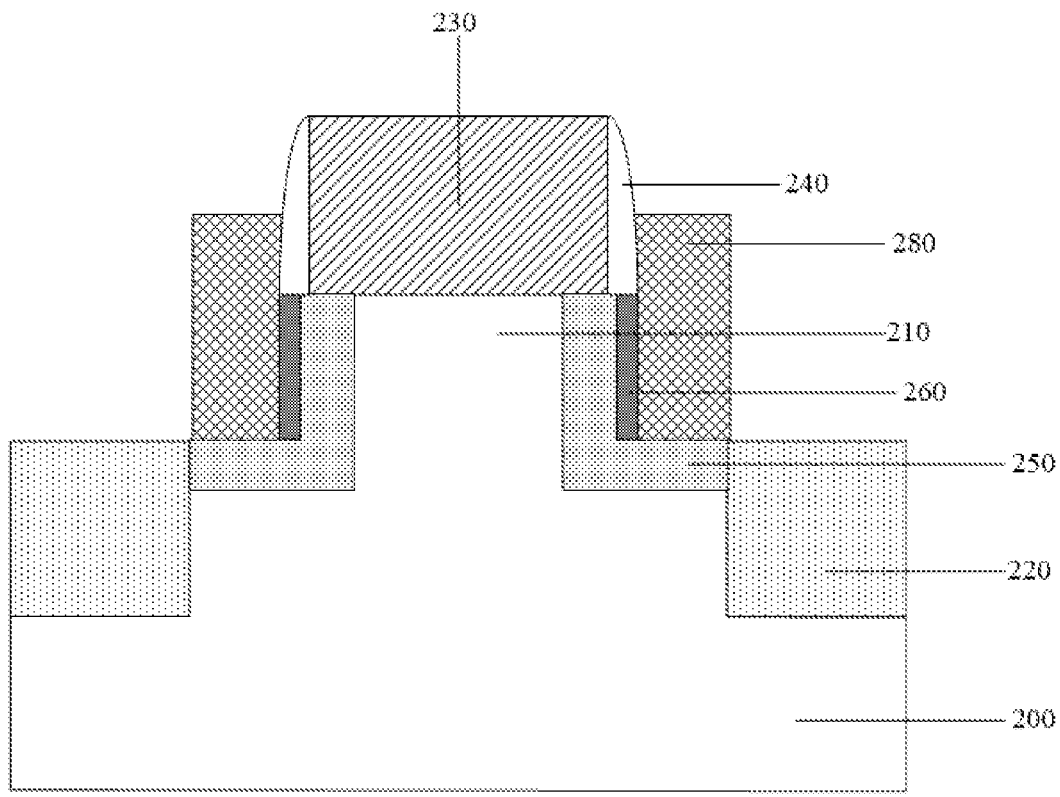

Returning to FIG. 15, after forming the doped source/drain regions, a second annealing process may be performed (S108). FIG. 13 illustrates a corresponding semiconductor structure.

As shown in FIG. 13, a second annealing process is performed to repair and activate the ions in the doped source/drain regions 280; and cause the ions in the doped source/drain regions 280 to further diffuse into the counter doped regions 260. Further, the second annealing process may also cause the ions in the counter doped regions 260 to further diffuse into the doped source/drain regions 280. Because the doping type of the ions in the doped source/drain regions 280 may be opposite to the doping type of the ions in the counter doped regions 260, after the inter-diffusion between the doped source/drain regions 280 and the counter doped regions 260, the concentration of the ions in the doped source/drain regions 280 and the concentration of the ions in the counter doped regions 260 may be both reduced.

The second annealing process may be any appropriate thermal annealing process. In one embodiment, the second annealing process is a spike thermal annealing process. The temperature of the second annealing process may be any appropriate value. If the annealing temperature is too high, the short-channel effect of the fin field-effect transistor may be relatively severe. If the annealing temperature is too low, the repair effect to the lattice defects may not be as expected; and the degree of the inter-diffusion of the ions between doped source/drain regions 280 and the counter doped regions 260 may be substantially low.

In one embodiment, the annealing temperature of the second annealing process may be in a range of approximately 1000°-1100° C.

In one embodiment, after the second annealing process, the concentration of the ions in the doped source/drain regions 280 may be in a range of approximately 5.0E19 atom/cm$^3$-1.0E21 atom/cm$^3$.

In one embodiment, the disclosed the counter doped regions 260 is located outside the lightly doped region 250. The disclosed the counter doped region is different from conventional Pocket implantation region, which is located within a lightly doped region for the short channel effect.

Figure 14:
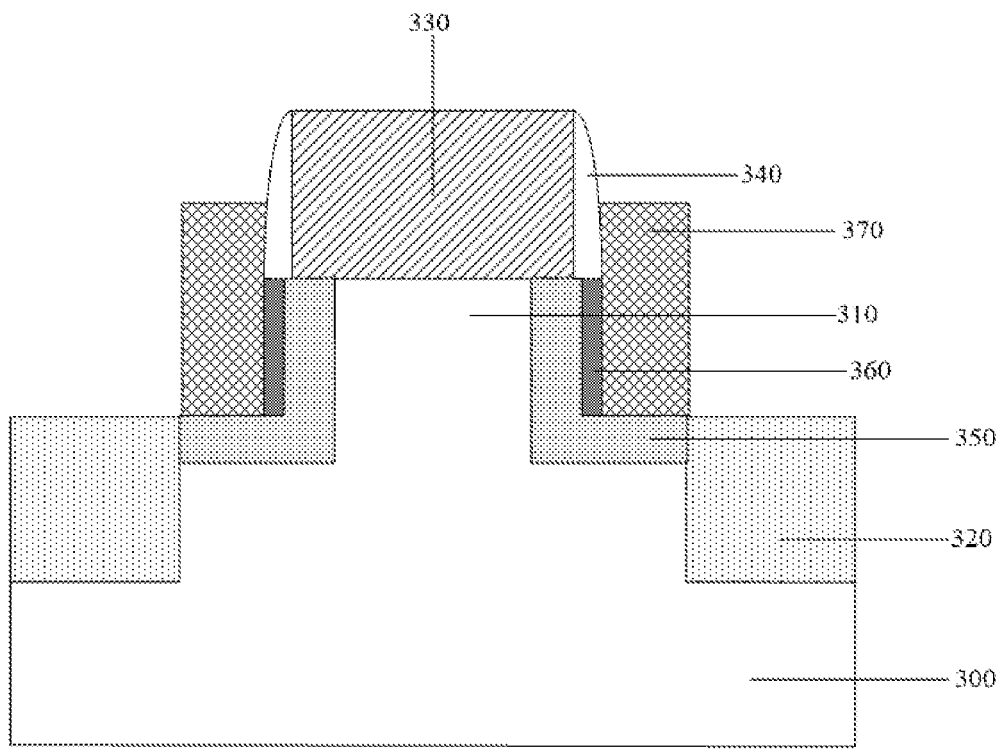
FIG. 14 illustrates an exemplary FinFET consistent with various disclosed embodiments.

Further, the present disclosure also provides a fin effect-field transistor. FIG. 14 illustrates an exemplary fin field-effect transistor consistent with various disclosed embodiments.

As shown in FIG. 14, the fin field-effect transistor may includes a semiconductor substrate 300 and a plurality of discrete fins 310 on the semiconductor substrate 300. The fin field-effect transistor may also include a gate structure 330 across the fins 310 by covering portions of top and side surfaces of the fins 310; and the portions of the fins 310 under the gate structure 330 may be configured as the channel regions. Further, the fin field-effect transistor may also include lightly doped regions 350 in the fins 310 and doped source/drain regions 370 in the fins 310 at both sides of the gate structure 330. Further, the fin field-effect transistor may also include counter doped regions 360; and the counter doped regions 360 may be between the lightly doped regions 350 and the doped source/drain regions 370.

In one embodiment, the semiconductor substrate 300 is made of silicon. In some embodiments, the semiconductor substrate may also be made of germanium, silicon germanium, silicon carbide, gallium arsenide, or gallium indium, etc. In some other embodiments, the semiconductor substrate may also be a silicon on insulator (SOI) substrate, or a germanium on insulator (GOI) substrate, etc.

In one embodiment, the fins 310 are made of silicon. In some embodiments, the fins may also be made of germanium, silicon germanium, silicon carbide, gallium arsenide, or gallium indium, etc.

In one embodiment, an isolation structure 320 may be formed on the semiconductor substrate 300. The isolation structure 320 may cover portions of the side surfaces of the fins 310; and the top surface of the isolation structure 320 may be below the top surfaces of the fins 310. The isolation structure 320 may be used to electrically isolate adjacent fins 310.

In one embodiment, the isolation structure 320 is made of silicon oxide. In some embodiments, the isolation structure may also be made of silicon nitride, or silicon oxynitride, etc.

In one embodiment, the gate structure 330 may be a polysilicon gate structure or a metal gate structure. Sidewall spacers 340 may be formed on the side surfaces of the gate structure 330. The sidewall spacers 340 may be used to define the positions of the lightly doped regions 350. The lightly doped regions 350 may be used to prevent the doped source/drain regions 370 from having an ion diffusion; and the junction leakage current may be reduced.

Figure 14A:
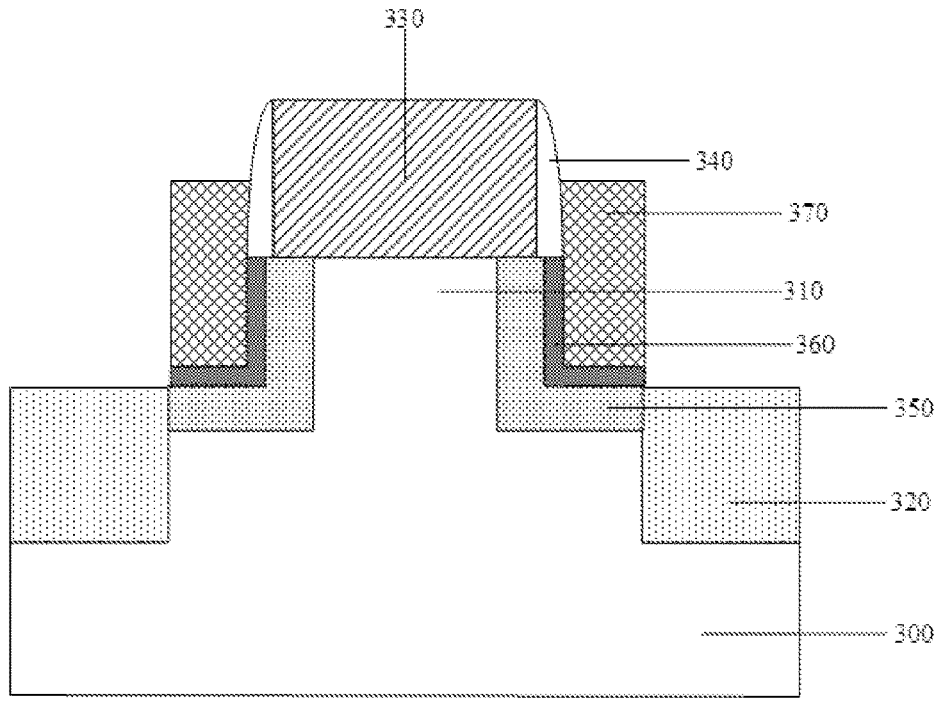

In one embodiment, the fin field-effect transistor may also include counter doped regions 360. Along the length direction of the fins 310, the counter doped regions 360 may be between the lightly doped regions 350 and the doped source/drain regions 370. In another embodiment, the counter doped region 360 may be between the lightly doped region 350 and the doped source/drain region 370 along the length direction of the fins 310 and a direction perpendicular to the semiconductor substrate 300 as shown in FIG. 14A.

In one embodiment, the concentration of the ions in doped source/drain regions 360 may be in a range of approximately 5.0E19 atom/cm$^3$-1.0E21 atom/cm$^3$. The counter doped regions 360 may be used to reduce the ion concentration in the doped source/drain regions 360. If the concentration of the ions in the doped source/drain regions 360 is too high, the transition of the ion distribution between the doped source/drain regions 360 and the lightly doped regions 350 may be too steep. That is, abrupt junctions may be formed; and the gate-induced drain leakage current issue of the fin field-effect transistor may be relatively severe. Forming the counter doped regions 360 may reduce the ion concentration in the doped source/drain regions 370. Thus, the gate-induced drain leakage current issue may be reduced; and the reliability of the fin effect-field transistor may be improved.

Thus, in the disclosed fabrication methods of the FinFET transistor, a lightly doping ion implantation process may be performed on the portions of the fins at both sides of the gate structure to form lightly doped regions. Then, a counter doping ion implantation process may be performed on the portions of the lightly doped regions away from the channel regions to form counter doped regions before performing the source/drain doping process to the portions of the fins at both sides of the gate structure to form the doped source/drain regions. Because the high concentration ions in the doped source/drain regions may have inter-diffusion with the ions in the lightly doped regions, the concentrations of the ions in the doped source/drain regions may be reduced. Thus, the steep scale of the transition of the ion diffusion between the doped source/drain regions and the lightly doped regions may be reduced. That is, graded junctions may be easily formed between the doped source/drain regions and the lightly doped regions. Thus, the gate-induced drain leakage current phenomenon may be reduced; and the reliability of the fin field-effect transistor may be improved.

Further, after the performing the ion implantation process on the doped source/drain epitaxial layers, a second annealing process may be performed. The second annealing process may be used to repair and activate the ions in the doped source/drain regions; and also allow the ions in the doped source/drain regions to further diffuse into the counter doped regions. Because the type of the ions in the doped source/drain regions and the type of the ions in the counter doped regions may be opposite, the concentration of the ions in the doped source/drain regions may be further reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A fin field-effect transistor, comprising:
a semiconductor substrate;
a plurality of fins on the semiconductor substrate;
a gate structure crossing the fins by covering portions of top and side surfaces of the fins, wherein portions of the fins under the gate structure are channel regions;
lightly doped regions in the fins at both sides of the gate structure;
doped source/drain regions in the fins at both sides of the gate structure; and
counter doped regions in the fins and between the lightly doped regions and the doped source/drain regions, wherein:
the counter doped regions are between the lightly doped regions and the doped source/drain regions along a length direction of the fins and a direction perpendicular to the semiconductor substrate.

2. The fin field-effect transistor according to claim 1, wherein:
a concentration of the ions in the doped source/drain regions is in a range of approximately 5.0E19 atom/cm$^3$-1.0E21 atom/cm$^3$.

3. The fin field-effect transistor according to claim 1, further comprising:
an isolation structure on the semiconductor substrate and covering portions of the side surfaces of the fins, and with a top surface below top surfaces of the fins.

4. The fin field-effect transistor according to claim 1, wherein:
the gate structure is one of a polysilicon gate structure and a metal gate structure.

5. The fin field-effect transistor according to claim 1, wherein:
the counter doped regions include ions having a concentration in a range of approximately 1.0E18 atom/cm$^3$-1.0E20 atom/cm$^3$.

6. The fin field-effect transistor according to claim 1, wherein:
the counter doped regions include ions implanted in a direction in a range of approximately 7°-30° with a normal direction of a top surface of the fins.

7. The fin field-effect transistor according to claim 1, wherein:
the counter doped regions include phosphor (P) ions having an implantation energy in a range of approximately 2 keV-10 keV and an implantation dose in a range of approximately 1.0E14 atom/cm$^2$-1.0E15 atom/cm$^2$.

8. The fin field-effect transistor according to claim 1, wherein:
the counter doped regions include boron (B) ions having an implantation energy in a range of approximately 5 keV-15 keV; and an implantation dose in a range of approximately 1.0E14 atom/cm$^2$-1.0E15 atom/cm$^2$.

* * * * *